US012598952B2

(12) United States Patent
Inoue et al.

(10) Patent No.: US 12,598,952 B2
(45) Date of Patent: Apr. 7, 2026

(54) MEMBER FOR SEMICONDUCTOR MANUFACTURING APPARATUS

(71) Applicant: NGK INSULATORS, LTD., Nagoya-City (JP)

(72) Inventors: Seiya Inoue, Handa-City (JP); Tatsuya Kuno, Nagoya-City (JP)

(73) Assignee: NGK INSULATORS, LTD., Nagoya (JP)

( * ) Notice: Subject to any disclaimer, the term of this patent is extended or adjusted under 35 U.S.C. 154(b) by 191 days.

(21) Appl. No.: 18/628,923

(22) Filed: Apr. 8, 2024

(65) Prior Publication Data

US 2025/0105043 A1     Mar. 27, 2025

Related U.S. Application Data

(63) Continuation of application No. PCT/JP2023/035051, filed on Sep. 27, 2023.

(51) Int. Cl.
*H01T 23/00* (2006.01)
*H01J 37/32* (2006.01)
*H01L 21/683* (2006.01)

(52) U.S. Cl.
CPC .... *H01L 21/6833* (2013.01); *H01J 37/32724* (2013.01); *H01J 2237/002* (2013.01); *H01J 2237/0044* (2013.01)

(58) Field of Classification Search
CPC .................................................. H01L 21/6833
See application file for complete search history.

(56) References Cited

U.S. PATENT DOCUMENTS

| | | | |
|---|---|---|---|
| 6,490,145 | B1 | 12/2002 | Kholodenko et al. |
| 2019/0035667 | A1 | 1/2019 | Minemura |
| 2020/0203207 | A1 | 6/2020 | Ikeguchi et al. |

(Continued)

FOREIGN PATENT DOCUMENTS

| | | |
|---|---|---|
| JP | 2006-344766 A | 12/2006 |
| JP | 2019-029384 A | 2/2019 |

(Continued)

OTHER PUBLICATIONS

International Search Report and Written Opinion (Application No. PCT/JP2023/035051) dated Dec. 12, 2023 (8 pages).

*Primary Examiner* — Stephen W Jackson
(74) *Attorney, Agent, or Firm* — BURR PATENT LAW, PLLC

(57) ABSTRACT

A member for semiconductor manufacturing apparatus includes a ceramic plate that has an upper surface including a reference surface on which multiple small projections for supporting a wafer are provided and that contains an electrostatic electrode; a plug arrangement hole that is provided in the ceramic plate; an electrostatic electrode opening portion that is provided at a position in the electrostatic electrode through which the plug arrangement hole extends; a cooling plate that is provided on a lower surface of the ceramic plate; a gas hole that extends through the cooling plate and that is in communication with the plug arrangement hole; a plug that is arranged in the plug arrangement hole and that includes a gas flow path; and a raised portion that surrounds the gas flow path and that has a top surface higher than the reference surface and lower than top surfaces of the small projections.

5 Claims, 5 Drawing Sheets

(56)                    References Cited

U.S. PATENT DOCUMENTS

| | | | |
|---|---|---|---|
| 2021/0225619 A1 | 7/2021 | Suzuki et al. | |
| 2021/0249236 A1 | 8/2021 | Senda | |
| 2023/0193466 A1* | 6/2023 | Rajagopalan | C23C 16/458 |
| | | | 356/630 |
| 2023/0369091 A1* | 11/2023 | Bi | H01J 37/32724 |
| 2023/0420222 A1* | 12/2023 | Wang | H01J 37/32449 |

FOREIGN PATENT DOCUMENTS

| | | |
|---|---|---|
| JP | 2020-102620 A | 7/2020 |
| JP | 2021-128956 A | 9/2021 |
| JP | 2023-101194 A | 7/2023 |
| JP | 2023-106928 A | 8/2023 |
| WO | 2020/004478 A1 | 1/2020 |

* cited by examiner

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

A known member for semiconductor manufacturing apparatus includes a ceramic plate that has a wafer placement surface and that contains an electrostatic electrode and a cooling plate that is provided on a lower surface of the ceramic plate. A ceramic plate disclosed in PTL 1 has plug arrangement holes that extend through the ceramic plate in an up-down direction and porous plugs that are arranged in the plug arrangement holes. A cooling plate disclosed in PTL 1 has gas holes that extend through the cooling plate in the up-down direction and that are in communication with the plug arrangement holes. As for the member for semiconductor manufacturing apparatus, helium gas is introduced into the porous plugs via the gas holes of the cooling plate with a wafer electrostatically attracted on a wafer placement surface. The helium gas is then supplied to a back surface of the wafer and improves heat conduction between the wafer and the ceramic plate. At this time, the helium gas passes through pores in the porous plugs, and accordingly, arc discharge can be inhibited from occurring along the back surface of the wafer unlike the case where no porous plugs are included.

CITATION LIST

Patent Literature

PTL 1: JP 2019-29384 A

SUMMARY OF THE INVENTION

Typically, the diameters of the porous plugs are relatively large in order to ensure the flow rate of the helium gas that flows through the porous plugs, and the diameters of the plug arrangement holes are typically large accordingly. Electrostatic electrode opening portions are provided at positions in an electrostatic electrode through which the plug arrangement holes extend. The diameters of the electrostatic electrode opening portions increase as the diameters of the plug arrangement holes increase. The electrostatic electrode is not located at portions in the wafer placement surface right above the electrostatic electrode opening portions, and wafer attraction force reduces there. Increasing the diameters of the electrostatic electrode opening portions makes the reduction in the wafer attraction force remarkable. As a result, the heat of the portions right above the electrostatic electrode opening portions is not sufficiently removed by the cooling plate and is likely to have hot spot singularity.

The present invention has been accomplished to solve the problems, and it is a main object to inhibit portions right above electrostatic electrode opening portions from having singularity.

[1] A member for semiconductor manufacturing apparatus according to the present invention includes a ceramic plate that has an upper surface including a wafer placement surface including a reference surface on which multiple small projections for supporting a wafer are provided and that contains an electrostatic electrode, a plug arrangement hole that extends in an up-down direction and that is provided in the ceramic plate, an electrostatic electrode opening portion that is provided at a position in the electrostatic electrode through which the plug arrangement hole extends and that has a diameter equal to or larger than that of the plug arrangement hole, a cooling plate that is provided on a lower surface of the ceramic plate, a gas hole that extends through the cooling plate in the up-down direction and that is in communication with the plug arrangement hole, a plug that is arranged in the plug arrangement hole and that includes a gas flow path through which heat conduction gas is to flow in the up-down direction, and a raised portion that surrounds the gas flow path and that has a top surface higher than the reference surface and lower than top surfaces of the small projections.

As for the member for semiconductor manufacturing apparatus, the raised portion that has the top surface higher than the reference surface and lower than the top surfaces of the small projections surrounds the gas flow path. The thermal conductivity of the raised portion is higher than the thermal conductivity of the heat conduction gas. For this reason, wafer attraction force is weak at a portion in the wafer placement surface right above the electrostatic electrode opening portion, but the heat of the portion right above the electrostatic electrode opening portion is likely to be conducted to the cooling plate via the raised portion. Since the top surface of the raised portion is higher than the reference surface, the conduction of the heat of the portion right above the electrostatic electrode opening portion is facilitated, and the temperature of the portion right above the electrostatic electrode opening portion can be prevented from being too high. Since the top surface of the raised portion is lower than the top surfaces of the small projections, the conduction of the heat of the portion right above the electrostatic electrode opening portion can be prevented from being excessively facilitated, and the temperature of the portion right above the electrostatic electrode opening portion can be prevented from being too low. Accordingly, the portion right above the electrostatic electrode opening portion can be inhibited from having singularity.

In the present specification, the words "up" and "down" do not represent an absolute positional relationship but represent a relative positional relationship. For this reason, the words "up" and "down" are changed into "down" and "up", "left" and "right", or "front" and "back depending on the direction of the member for semiconductor manufacturing apparatus.

[2] As for the member for semiconductor manufacturing apparatus (as for the member for semiconductor manufacturing apparatus described in [1] described above) according to the present invention, the raised portion and the ceramic plate may be a one-piece. For this reason, the raised portion and the ceramic plate are a one-piece (the raised portion is a portion of the ceramic plate), and consequently, the raised portion can be relatively easy to form.

[3] As for the member for semiconductor manufacturing apparatus (as for the member for semiconductor manufacturing apparatus described in [1] or [2] described above) according to the present invention, the raised portion may include a plug covering portion that covers an upper surface of the plug, and the plug covering portion may have a small hole that extends therethrough in the up-down direction. In this way, the plug is protected by the plug covering portion.

[4] As for the member for semiconductor manufacturing apparatus (as for the member for semiconductor manufacturing apparatus described in [1] described above) according to the present invention, the plug may be a dense body that includes the gas flow path. The use of the dense body that includes the gas flow path as the plug eliminates the necessity of another raised portion that differs from the plug.

[5] As for the member for semiconductor manufacturing apparatus (as for the member for semiconductor manufacturing apparatus described in [1], [2], or [4] described above) according to the present invention, the plug arrangement hole may extend through the ceramic plate in the up-down direction, the plug may protrude from an upper opening of the plug arrangement hole and may function as the raised portion, and an upper surface of the plug and an upper surface of the raised portion may have the same height.

[6] As for the member for semiconductor manufacturing apparatus (as for the member for semiconductor manufacturing apparatus described in any one of [1] to [5] described above) according to the present invention, depths Y from the top surfaces of the small projections to the top surface of the raised portion may be no less than ½ and no more than ⅔ of heights A from the reference surface to the top surfaces of the small projections. When the depths Y are more than ⅔ of the heights A, the heat of the portion right above the electrostatic electrode opening portion is unlikely to be sufficiently conducted to the cooling plate. When the depths Y are less than ½ of the heights A, there is a possibility that the heat of the portion right above the electrostatic electrode opening portion is excessively conducted to the cooling plate, and the flow of the heat conduction gas is impeded.

[7] As for the member for semiconductor manufacturing apparatus (as for the member for semiconductor manufacturing apparatus described in any one of [1] to [6] described above) according to the present invention, the raised portion may have a ring shape in a plan view, and an outer diameter of the raised portion may be larger than an outer diameter of the gas flow path and may be equal to or smaller than the diameter of the electrostatic electrode opening portion. In this way, effects of the present invention are likely to be obtained.

DETAILED DESCRIPTION OF THE INVENTION

Figure 1:
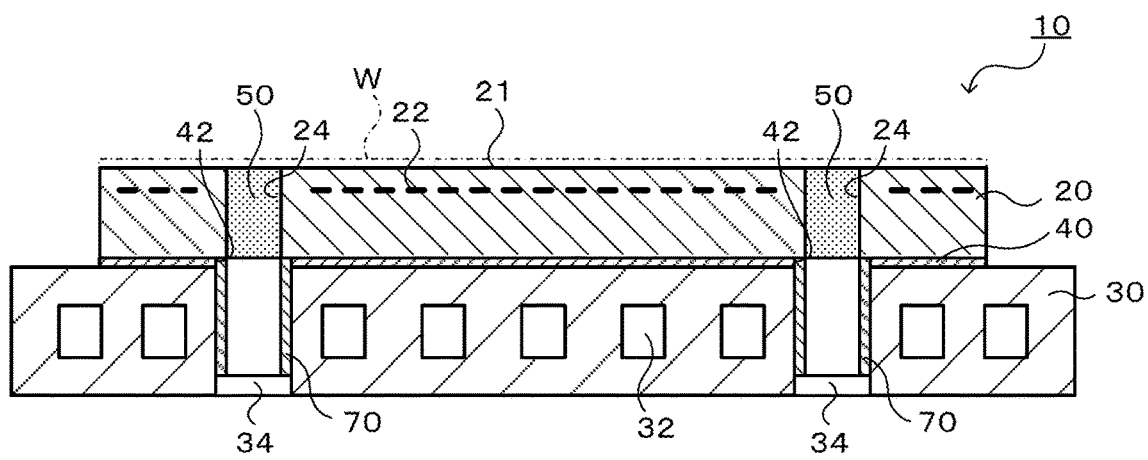
FIG. 1 illustrates a vertical cross-section of a member 10 for semiconductor manufacturing apparatus.
Figure 2:
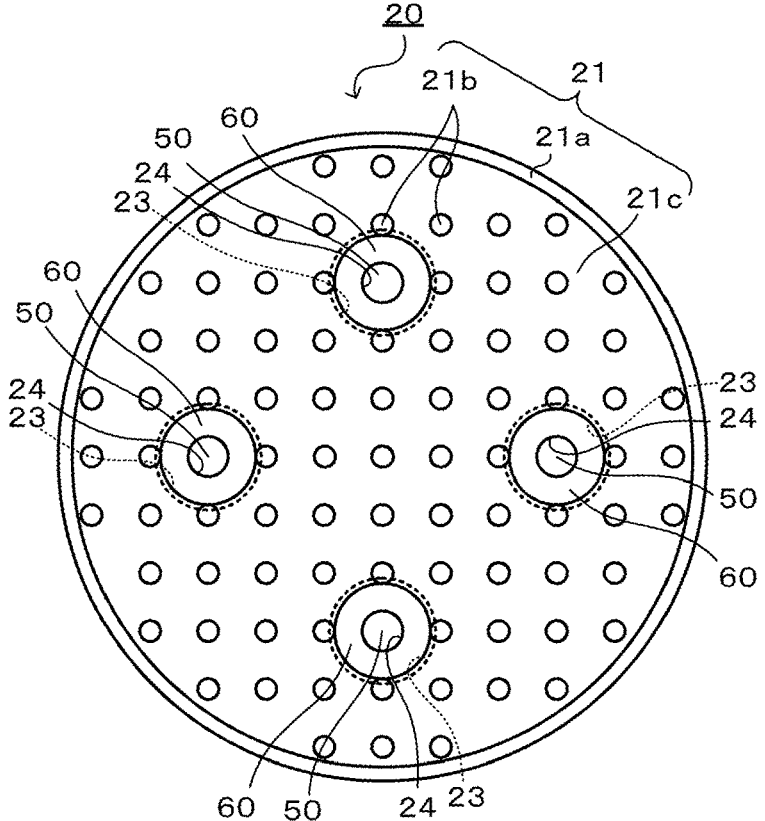
FIG. 2 is a plan view of a ceramic plate 20.
Figure 3:
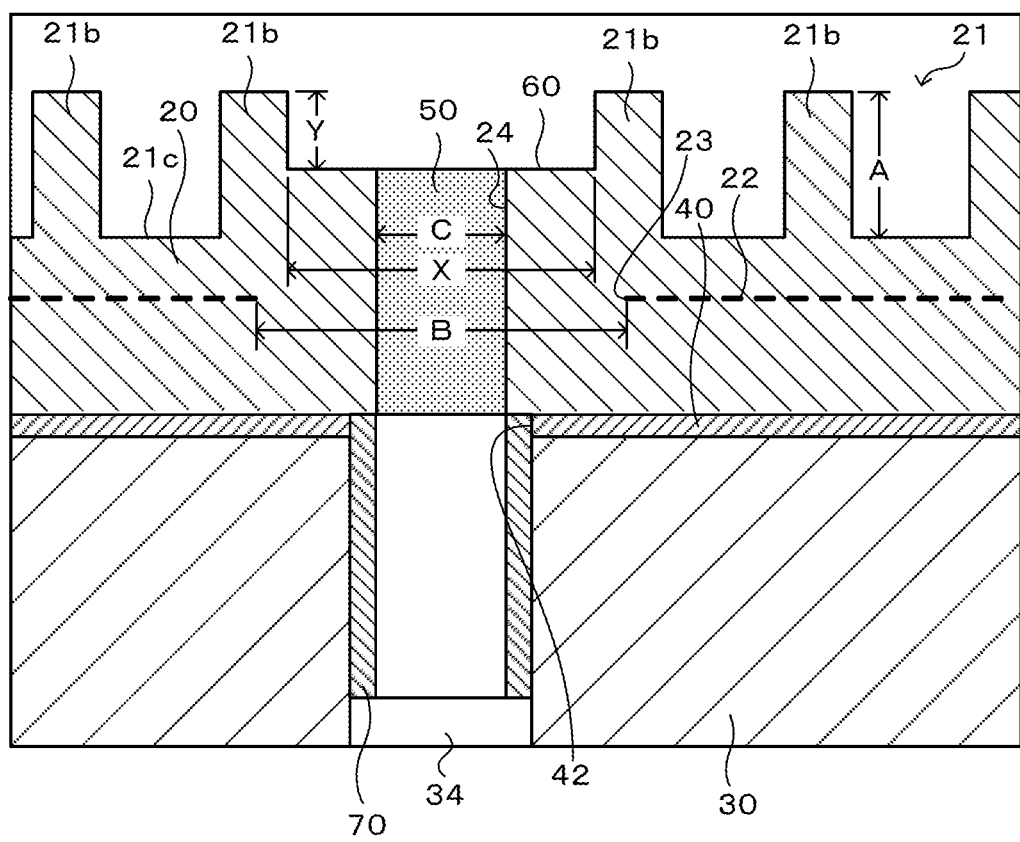
FIG. 3 is an enlarged view of a portion in FIG. 1.

A preferred embodiment of the present invention will now be described with reference to the drawings. FIG. 1 illustrates a vertical cross-section of a member 10 for semiconductor manufacturing apparatus. FIG. 2 is a plan view of a ceramic plate 20. FIG. 3 is an enlarged view of a portion in FIG. 1. In FIG. 3, the heights of circular small projections 21b and raised portions 60 are exaggeratedly illustrated.

As illustrated in FIG. 1, the member 10 for semiconductor manufacturing apparatus includes the ceramic plate 20, a cooling plate 30, a metal joining layer 40, porous plugs 50, the raised portions 60 (see FIG. 2 and FIG. 3), and insulating tubes 70.

The ceramic plate 20 is a ceramic disk (for example, a diameter of 300 mm and a thickness of 5 mm) such as an alumina sintered body or an aluminum nitride sintered body. An upper surface of the ceramic plate 20 corresponds to a wafer placement surface 21. The ceramic plate 20 contains an electrode 22. On the wafer placement surface 21 of the ceramic plate 20, as illustrated in FIG. 2, a seal band 21a is formed along an outer edge, and the multiple circular small projections 21b are formed over the entire surface. The seal band 21a and the circular small projections 21b have the same height, and the height thereof is, for example, several µm to several tens of µm. The electrode 22 is a mesh electrode that is used as an electrostatic electrode and that has a flat plate shape, and a direct voltage can be applied thereto. When the direct voltage is applied to the electrode 22, a wafer W is attracted and secured to the wafer placement surface 21 (specifically, an upper surface of the seal band 21a and upper surfaces of the circular small projections 21b) due to electrostatic attraction force. When applying the direct voltage ends, the wafer W that is attracted and secured to the wafer placement surface 21 is released. A portion of the wafer placement surface 21 on which the seal band 21a, the circular small projections 21b, and the raised portions 60 (described later) are not provided is referred to as a reference surface 21c.

Plug arrangement holes 24 are provided in the ceramic plate 20 so as to extend through the electrode 22 in an up-down direction. The plug arrangement holes 24 are cylindrical holes that extend through the ceramic plate 20 in the up-down direction and are provided at multiple positions (for example, multiple positions equally spaced from each other in a circumferential direction as illustrated in FIG. 2) in the ceramic plate 20. The porous plugs 50 described later are arranged in the plug arrangement holes 24. Electrode through-holes 23 are provided in the electrode 22 so as to be concentric with the plug arrangement holes 24. The diameters B of the electrode through-holes 23 are larger than the diameters of the plug arrangement holes 24.

The cooling plate 30 is a disk (a disk that has a diameter equal to or larger than that of the ceramic plate 20) that has good thermal conductivity and is provided on a lower surface of the ceramic plate 20. The cooling plate 30 contains a refrigerant flow path 32 through which refrigerant circulates and gas holes 34 in which gas is supplied to the porous plugs 50. The refrigerant flow path 32 is formed in a one-stroke pattern from an inlet to an outlet over the entire cooling plate 30 in a plan view. The gas holes 34 are cylindrical holes and are provided so as to face the plug arrangement holes 24. Examples of the material of the cooling plate 30 include a metal material and a composite material of metal and ceramics. Examples of the metal material include Al, Ti, Mo, or an alloy thereof. Examples of the composite material of metal and ceramics include a metal matrix composite material (MMC) and a ceramic matrix composite material (CMC). Specific examples of the composite material include a material that contains Si, SiC, and Ti (also referred to as SiSiCTi), a material obtained by impregnating a SiC porous body with Al and/or Si, and a composite material of $Al_2O_3$ and TiC. A material that has a coefficient of thermal expansion close to that of the ceramic plate 20 is preferably selected as the material of the cooling plate 30. The cooling plate 30 is also used as a RF electrode.

The metal joining layer 40 joins the lower surface of the ceramic plate 20 and an upper surface of the cooling plate 30 to each other. The metal joining layer 40 is formed by, for example, TCB (Thermal compression bonding). The TCB is a known method of compressing and joining two members in a state in which the two members to be joined interpose a metal joining material therebetween and are heated to a temperature equal to or smaller than the solidus temperature of the metal joining material. The metal joining layer 40 has round holes 42 that extend through the metal joining layer 40 in the up-down direction so as to face the gas holes 34.

The porous plugs 50 are arranged and secured in the plug arrangement holes 24. Specifically, outer circumferential surfaces of the porous plugs 50 and inner circumferential surfaces of the plug arrangement holes 24 may be stuck to each other, or external thread portions that are provided on the outer circumferential surfaces of the porous plugs 50 may be screwed to internal thread portions that are provided on the inner circumferential surfaces of the plug arrange-ment holes 24. Alternatively, the porous plugs 50 and the ceramic plate 20 may be manufactured in a manner in which holes in the up-down direction are made in a molded plate before the ceramic plate 20 fired, mixed powder of ceramic powder and resin powder is filled in the holes, the whole of these is subsequently fired, the resin powder in the holes are consequently burned and disappear, and the ceramic powder is sintered. The porous plugs 50 entirely has multiple pores and accordingly enables heat conduction gas to flow in the up-down direction via the pores. For this reason, the porous plugs 50 serve as gas flow paths as a whole. Upper surfaces of the porous plugs 50 and upper surfaces of the raised portions 60 have the same height. The porous plugs 50 can be porous bulk bodies that are obtained by sintering the ceramic powder. Examples of ceramics can include alumina and aluminum nitride. The porosity of the porous plugs 50 is preferably 30% or more, and an average pore diameter is preferably 20 μm or more. The porosity of the porous plugs 50 may be 70% or less.

The raised portions 60 are ring-shaped portions that surround the porous plugs 50 (also the plug arrangement holes 24) and that are flat and dense. Parts of the raised portions 60 around the plug arrangement holes 24 are higher than the reference surface 21c and lower than top surfaces of the circular small projections 21b and the seal band 21a. The raised portions 60 and the ceramic plate 20 are the same object. For this reason, the thermal conductivity of the raised portions 60 is higher than the thermal conductivity of helium gas that is the heat conduction gas. Depths Y (lengths in the up-down direction from the upper surfaces of the circular small projections 21b to the upper surfaces of the raised portions 60) of the raised portions 60 are preferably no less than ½ and no more than ⅔ of the heights A (lengths in the up-down direction from the reference surface 21c to the upper surfaces of the circular small projections 21b) of the circular small projections 21b. The inner diameters of the raised portions 60 are equal to the diameters C (are equal to the outer diameters of the gas flow paths) of the porous plugs 50. The outer diameters X of the raised portions 60 are larger than the diameters C of the porous plugs 50 and are equal to or smaller than the diameters B of the electrode through-holes 23.

The insulating tubes 70 are composed of dense ceramics (such as dense alumina) and are circular in a plan view. Outer circumferential surfaces of the insulating tubes 70 are stuck to inner circumferential surfaces of the round holes 42 of the metal joining layer 40 and inner circumferential surfaces of the gas holes 34 of the cooling plate 30 by using adhesive layers not illustrated. The adhesive layers may be organic adhesive layers (resin adhesive layers) or inorganic adhesive layers. The adhesive layers may be additionally provided between upper surfaces of the insulating tubes 70 and the lower surface of the ceramic plate 20. Interior spaces of the insulating tubes 70 are in communication with the porous plugs 50. For this reason, the gas that is introduced into the gas holes 34 passes through the insulating tubes 70 and the porous plugs 50 and is supplied to a back surface of the wafer W.

An example of the use of the member 10 for semicon-ductor manufacturing apparatus thus configured will now be described. The wafer W is first placed on the wafer place-ment surface 21 with the member 10 for semiconductor manufacturing apparatus installed in a chamber not illus-trated. The pressure of the chamber is decompressed by a vacuum pump and is adjusted such that a predetermined degree of vacuum is achieved. A direct voltage is applied to the electrode 22 of the ceramic plate 20 to generate elec-trostatic attraction force, and the wafer W is attracted and secured to the wafer placement surface 21 (specifically, the upper surface of the seal band 21a and the upper surfaces of the circular small projections 21b). Subsequently, a reactive gas atmosphere at a predetermined pressure (for example, several tens of Pa to several hundreds of Pa) is created in the chamber. In this state, a high-frequency voltage is applied between an upper electrode, not illustrated, on a ceiling portion in the chamber and the cooling plate 30 of the member 10 for semiconductor manufacturing apparatus, and plasma is generated. The surface of the wafer W is processed by the generated plasma. The refrigerant circulates through the refrigerant flow path 32 of the cooling plate 30. Backside gas is introduced into the gas holes 34 from a gas tank not illustrated. Heat conduction gas (such as helium) is used as the backside gas. The backside gas passes through the insulating tubes 70 and the porous plugs 50, is supplied to a space between the back surface of the wafer W and the reference surface 21c of the wafer placement surface 21 and spaces between the back surface of the wafer W and the raised portions 60, and is sealed. The backside gas enables heat conduction between the wafer W and the ceramic plate 20 to be efficient.

An example of manufacturing the member 10 for semi-conductor manufacturing apparatus will now be described. The member 10 for semiconductor manufacturing apparatus that has the wafer placement surface 21 that is flat (the seal band 21a, the circular small projections 21b, and the raised portions 60 are not formed) is first manufactured. A method of manufacturing this is known (for example, PTL 1), and accordingly, a description for this is omitted here. A mask that has circular through-holes at positions corresponding to the positions of the raised portions 60 is put on the wafer placement surface 21 that is flat, a blasting process is performed on exposed portions, and the mask is subse-quently removed. Consequently, the raised portions 60 are formed. Subsequently, a mask that covers portions at posi-tions corresponding to the positions of the seal band 21a and the circular small projections 21b and portions at positions corresponding to the positions of the raised portions 60 is formed on the wafer placement surface 21, the blasting process is performed on exposed portions, and the mask is subsequently removed. Consequently, the seal band 21a, the circular small projections 21b, and the reference surface 21c are formed. In this way, the member 10 for semiconductor manufacturing apparatus is obtained.

As for the member 10 for semiconductor manufacturing apparatus described in detail above, the raised portions 60 the thermal conductivity of which is higher than that of the heat conduction gas surround the porous plugs 50 (correspond to the gas flow paths as a whole). For this reason, the wafer attraction force is weak at portions in the wafer placement surface 21 right above the electrode through-holes 23, but the heat of the portions right above the electrode through-holes 23 is likely to be conducted to the cooling plate 30 via the raised portions 60. Since the top surfaces of the raised portions 60 are higher than the reference surface 21*c*, the conduction of the heat of the portions right above the electrode through-holes 23 is facilitated, and the temperature of the portions right above the electrode through-holes 23 can be prevented from being too high. Since the top surfaces of the raised portions 60 are lower than the top surfaces of the circular small projections 21*b*, the conduction of the heat of the portions right above the electrode through-holes 23 can be prevented from being excessively facilitated, and the temperature of the portions right above the electrode through-holes 23 can be prevented from being too low. Accordingly, the portions right above the electrode through-holes 23 can be inhibited from having singularity such as a hot spot.

The raised portions 60 and the ceramic plate 20 are a one-piece. The thermal conductivity of the ceramic plate 20 is typically higher than that of the heat conduction gas (for example, the thermal conductivity of alumina is about 30 W/mK, the thermal conductivity of aluminum nitride is about 150 W/mK, and the thermal conductivity of helium gas is about 0.02 W/mK although this depends on the pressure of the gas that is used). For this reason, the raised portions 60 and the ceramic plate 20 are a one-piece (the raised portions 60 are portions of the ceramic plate 20), and consequently, the raised portions 60 can be relatively easy to form.

The upper surfaces of the porous plugs 50 and the upper surfaces of the raised portions 60 have the same height. For this reason, processing is relatively easy unlike the case where the upper surfaces of the porous plugs 50 and the upper surfaces of the raised portions 60 have different heights.

The depths Y from the top surfaces of the circular small projections 21*b* to the top surfaces of the raised portions 60 are preferably no less than ½ and no more than ⅔ of the heights A from the reference surface 21*c* to the top surfaces of the circular small projections 21*b*. When the depths Y are more than ⅔ of the heights A, the heat of the portions right above the electrode through-holes 23 is unlikely to be sufficiently conducted to the cooling plate 30, which is not preferable. When the depths Y are less than ½ of the heights A, there is a possibility that the heat of the portions right above the electrode through-holes 23 is excessively conducted to the cooling plate 30, and the flow of the heat conduction gas is impeded, which is not preferable.

The raised portions 60 have a ring shape in a plan view. The outer diameters X of the raised portions 60 are larger than the diameters C of the porous plugs 50 and are equal to or smaller than the diameters B of the electrode through-holes 23. In this way, the effects of the present invention are likely to be obtained.

It goes without saying that the present invention is not limited to the embodiment described above at all and can be carried out with various embodiments provided that the embodiments are within the technical range of the present invention.

Figure 4:
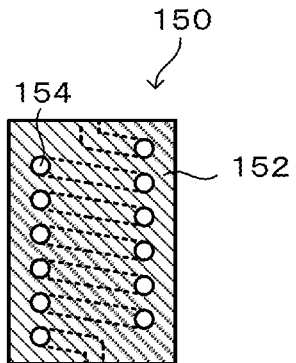
FIG. 4 is an enlarged view of a portion in a vertical cross-section according to another embodiment.

According to the embodiment described above, a plug 150 illustrated in FIG. 4 may be used instead of the porous plug 50. The plug 150 is a columnar dense body 152 that includes a gas flow path 154. The dense body 152 is composed of a material (such as a ceramic material) that has thermal conductivity higher than that of helium that is the heat conduction gas. The gas flow path 154 is a spiral flow path that is provided in the dense body 152 and opens at an upper surface and lower surface of the dense body 152. For this reason, the gas can flow in the up-down direction. In this case, the outer diameter of the gas flow path 154 is the diameter of the outer circumferential edge of the gas flow path 154 in a plan view of the gas flow path 154. Also in the case where the plug 150 is used instead of the porous plug 50, the same effects as those according to the embodiment described above can be obtained. The shape of the gas flow path 154 is not limited to a spiral shape but may be, for example, a zigzag shape.

Figure 5:
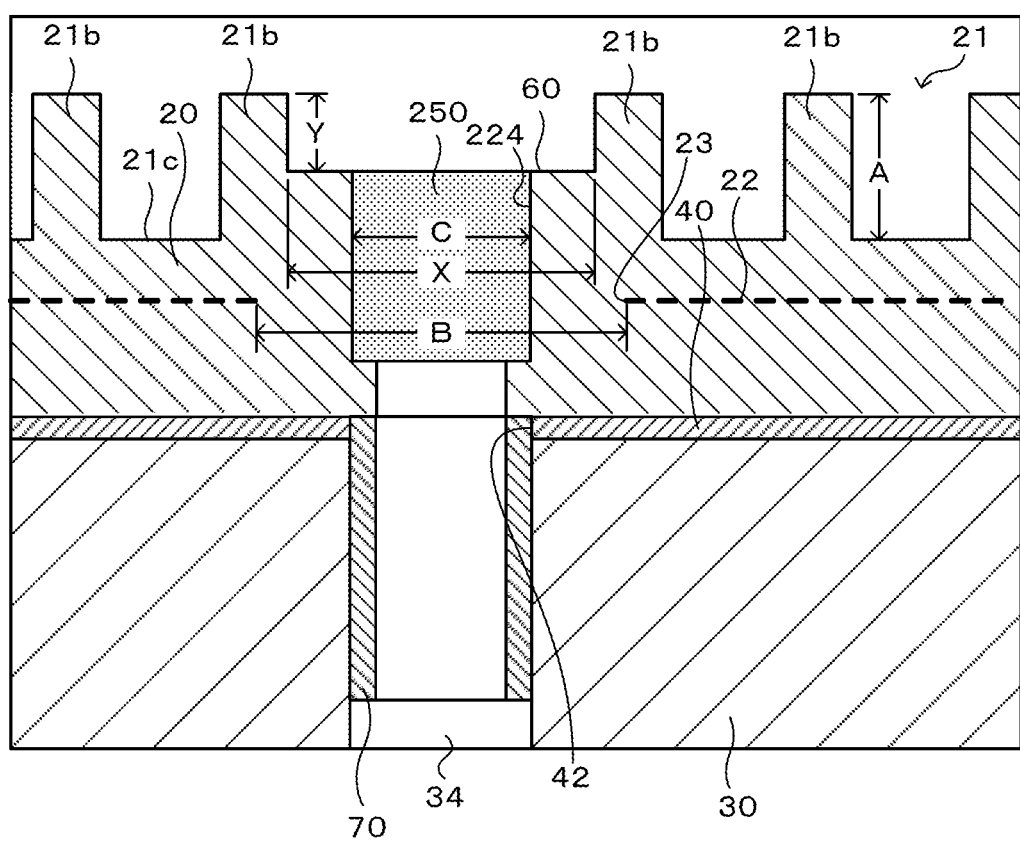
FIG. 5 is an enlarged view of a portion in a vertical cross-section according to another embodiment.

In an example according to the embodiment described above, the lengths of the porous plugs 50 in the up-down direction are equal to the lengths of the plug arrangement holes 24 in the up-down direction but are not particularly limited thereto. For example, in FIG. 3, the lengths of the porous plugs 50 in the up-down direction may be reduced, and the lower surfaces of the porous plugs 50 may be higher than lower openings of the plug arrangement holes 24. Alternatively, the lengths of the porous plugs 50 in the up-down direction may be increased, and the lower surfaces of the porous plugs 50 may be lower than the lower openings of the plug arrangement holes 24 and may be in the insulating tubes 70. Alternatively, as illustrated in FIG. 5, a plug arrangement hole 224 with a step that includes an upper large-diameter portion and a lower small-diameter portion may be provided in the ceramic plate 20, and a porous plug 250 may be arranged in the upper large-diameter portion. Also in all of the cases of using these structures, the same effects as those according to the embodiment described above can be obtained. In FIG. 5, components like to those according to the embodiment described above are designated by using like reference signs. In FIG. 5, the plug 150 in FIG. 4 may be used instead of the porous plug 250.

Figure 6:
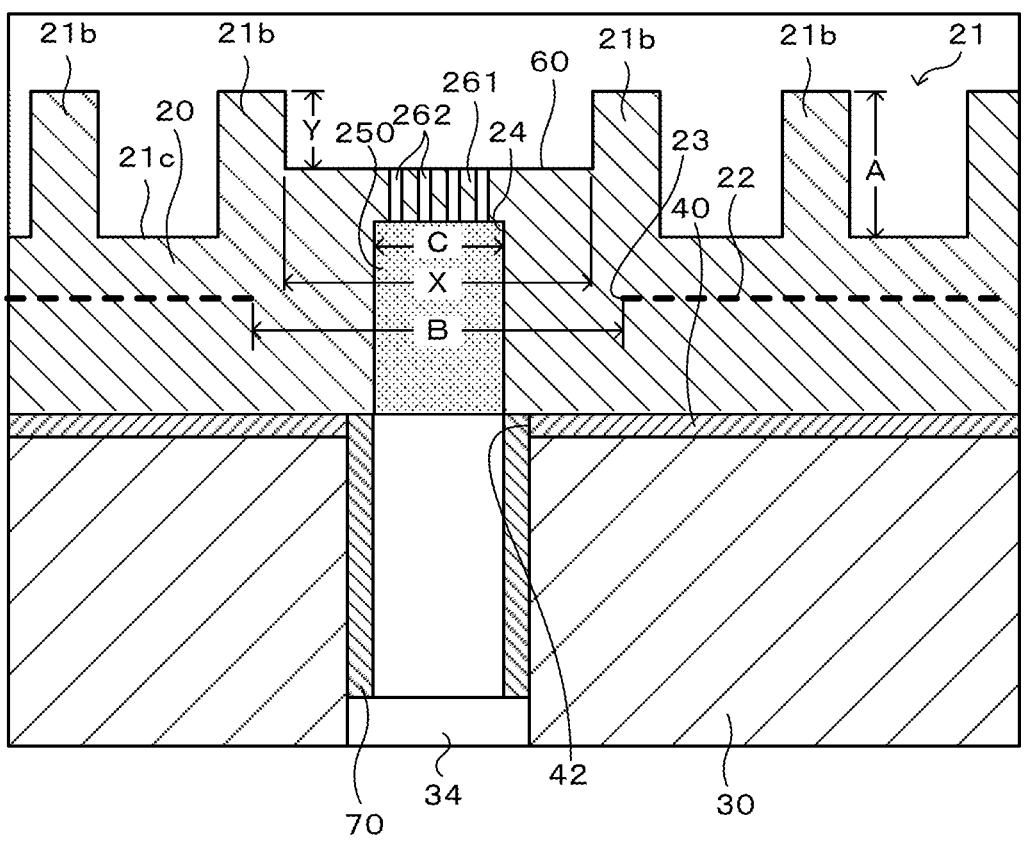
FIG. 6 is an enlarged view of a portion in a vertical cross-section according to another embodiment.

According to the embodiment described above, the upper surfaces of the porous plugs 50 and the upper surfaces of the raised portions 60 have the same height but are not particularly limited thereto. For example, a structure illustrated in FIG. 6 may be used. In FIG. 6, an upper surface of the porous plug 250 is lower than the upper surface of the raised portion 60, and the raised portion 60 includes a plug covering portion 261 that covers the upper surface of the porous plug 250. The plug covering portion 261 has multiple small holes 262 that extend therethrough in the up-down direction and that are in communication with the porous plug 250 (a gas flow path). The plug covering portion 261 and the ceramic plate 20 may be a one-piece, or the plug covering portion 261 may be a ceramic lid that differs from the ceramic plate 20. Also in the case of using the structure in FIG. 6, the same effects as those according to the embodiment described above can be obtained. In addition, the porous plug 250 is protected by the plug covering portion 261. In FIG. 6, components like to those according to the embodiment described above are designated by using like reference signs.

Figure 7:
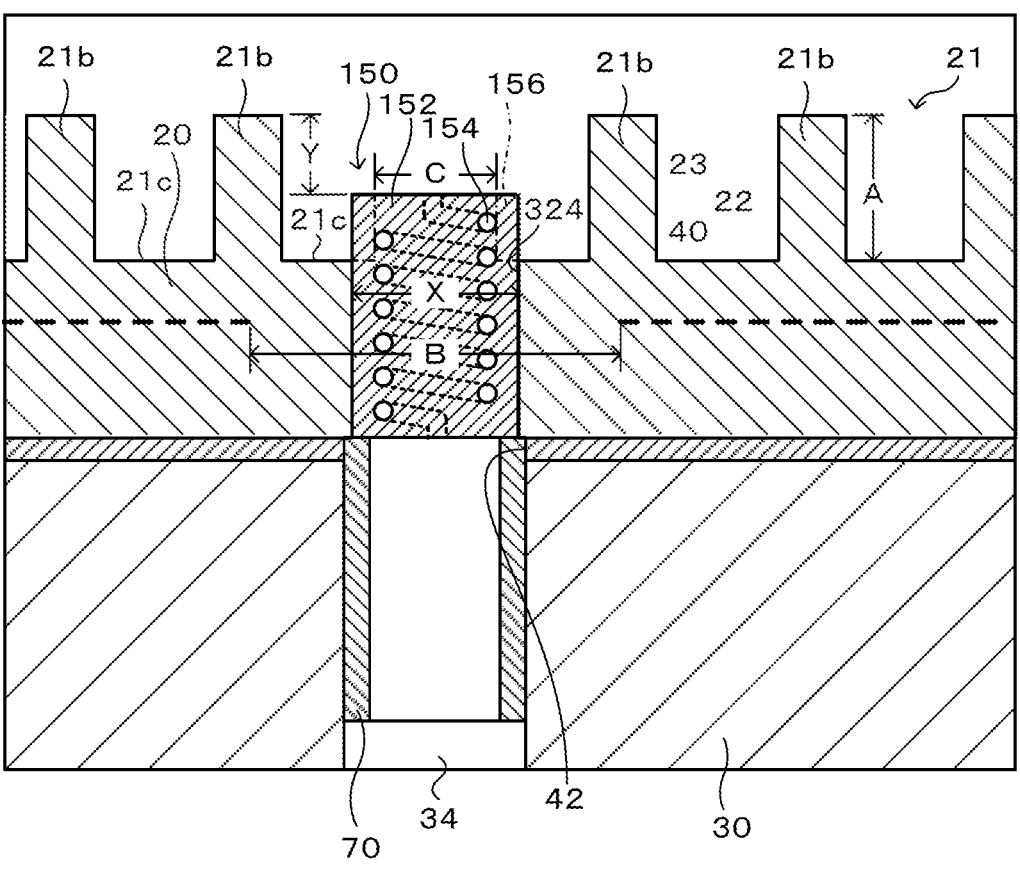
FIG. 7 is an enlarged view of a portion in a vertical cross-section according to another embodiment.

According to the embodiment described above, the porous plugs 50 and the raised portions 60 are separated bodies but are not particularly limited thereto. For example, a structure illustrated in FIG. 7 may be used. The plug 150 in FIG. 7 is the columnar dense body 152 that includes the gas flow path 154 as described above (see FIG. 4) and is used instead of the porous plug 50 and the raised portion 60. In this case, a plug arrangement hole 324 is provided in a region that is surrounded by the multiple circular small projections 21*b* as in the plug arrangement holes 24 in FIG. 2. The length of the plug 150 in the up-down direction is greater than the length of the plug arrangement hole 324 in the up-down direction. For this reason, the plug 150 protrudes upward from an upper opening of the plug arrangement hole 324, and a dense portion 156 (a ring-shaped portion that is surrounded by a one-dot chain line in FIG. 7) of the protruding portion that surrounds the gas flow path 154 functions as a raised portion. The outer diameter X of the ring-shaped portion 156 that serves as the raised portion is larger than the outer diameter C of the gas flow path 154 and is equal to or smaller than the diameter B of the electrode through-hole 23. Also in the case of using the structure in FIG. 7, the same effects as those according to the embodiment described above can be obtained. In addition, the plug 150 is the dense body 152 that includes the gas flow path 154, and consequently, it is not necessary to provide another raised portion that differs from the plug 150. In FIG. 7, components like to those according to the embodiment described above are designated by using like reference signs.

According to the embodiment described above, the insulating tubes 70 are provided, but the insulating tubes 70 may be omitted. A gas channel structure may be provided instead of the gas holes 34 that are provided in the cooling plate 30. The gas channel structure may include a ring portion that is provided in the cooling plate 30 and that is concentric with the cooling plate 30 in a plan view, an introduction portion that introduces the gas into the ring portion from a back surface of the cooling plate 30, and distribution portions (corresponding to the gas holes 34 described above) that distribute the gas from the ring portion to the respective porous plugs 50. The number of the introduction portion may be smaller than the number of the distribution portions and may be, for example, one. Alternatively, the ring portion of the gas channel structure may be in the ceramic plate 20.

According to the embodiment described above, an electrostatic electrode is taken as an example of the electrode 22 that is contained in the ceramic plate 20, but this is not a particular limitation. For example, in addition to the electrode 22, a heater electrode (a resistance heating element) may be contained in the ceramic plate 20, or a RF electrode may be contained therein.

According to the embodiment described above, the ceramic plate 20 and the cooling plate 30 are joined to each other by using the metal joining layer 40, but a resin adhesive layer may be used instead of the metal joining layer 40.

International Application No. PCT/JP2023/035051, filed on Sep. 27, 2023, is incorporated herein by reference in its entirety.

What is claimed is:

1. A member for semiconductor manufacturing apparatus comprising:
   a ceramic plate that has an upper surface including a wafer placement surface including a reference surface on which multiple small projections for supporting a wafer are provided and that contains an electrostatic electrode;
   a plug arrangement hole that extends in an up-down direction and that is provided in the ceramic plate;
   an electrostatic electrode opening portion that is provided at a position in the electrostatic electrode through which the plug arrangement hole extends and that has a diameter equal to or larger than that of the plug arrangement hole;
   a cooling plate that is provided on a lower surface of the ceramic plate;
   a gas hole that extends through the cooling plate in the up-down direction and that is in communication with the plug arrangement hole;
   a plug that is arranged in the plug arrangement hole and that includes a gas flow path through which heat conduction gas is to flow in the up-down direction; and
   a raised portion that surrounds the gas flow path and that has a top surface higher than the reference surface and lower than top surfaces of the small projections,
   wherein the raised portion and the ceramic plate are a one-piece.

2. The member for semiconductor manufacturing apparatus according to claim 1,
   wherein the raised portion includes a plug covering portion that covers an upper surface of the plug, and
   wherein the plug covering portion has a small hole that extends therethrough in the up-down direction.

3. The member for semiconductor manufacturing apparatus according to claim 1,
   wherein the plug is a dense body that includes the gas flow path.

4. The member for semiconductor manufacturing apparatus according to claim 1,
   wherein depths from the top surfaces of the small projections to the top surface of the raised portion are no less than ½ and no more than ⅔ of heights from the reference surface to the top surfaces of the small projections.

5. The member for semiconductor manufacturing apparatus according to claim 1,
   wherein the raised portion has a ring shape in a plan view, and
   wherein an outer diameter of the raised portion is larger than an outer diameter of the gas flow path and is equal to or smaller than the diameter of the electrostatic electrode opening portion.

* * * * *